United States Patent
Odawara et al.

(10) Patent No.: US 7,498,612 B2
(45) Date of Patent: Mar. 3, 2009

(54) COMPOUND SEMICONDUCTOR LIGHT-EMITTING DEVICE HAVING PN-JUNCTION TYPE HETERO STRUCTURE AND FORMING METHOD THEREOF

(75) Inventors: Michiya Odawara, Chichibu (JP); Akira Kasahara, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 46 days.

(21) Appl. No.: 10/577,475

(22) PCT Filed: Oct. 22, 2004

(86) PCT No.: PCT/JP2004/016076

§ 371 (c)(1),
(2), (4) Date: Oct. 12, 2006

(87) PCT Pub. No.: WO2005/043635

PCT Pub. Date: May 12, 2005

(65) Prior Publication Data

US 2007/0131959 A1 Jun. 14, 2007

Related U.S. Application Data

(60) Provisional application No. 60/518,743, filed on Nov. 12, 2003.

(30) Foreign Application Priority Data

Oct. 31, 2003 (JP) .............................. 2003-371837

(51) Int. Cl.
*H01L 33/00* (2006.01)
(52) U.S. Cl. .................. 257/103; 257/94; 257/E33.01
(58) Field of Classification Search ................. 257/103, 257/94, E33.001
See application file for complete search history.

(56) References Cited

U.S. PATENT DOCUMENTS 6,259,122 B1 * 7/2001 Ota et al. .................... 257/101
2003/0178631 A1 * 9/2003 Udagawa ..................... 257/99
2003/0234400 A1 * 12/2003 Udagawa ..................... 257/80

FOREIGN PATENT DOCUMENTS

JP 5-183189 7/1993

(Continued)

OTHER PUBLICATIONS

Isamu Akasaki; "Group III-V compound semiconductor"; Advanced Electronics Series; vol. I-1; May 20, 1994; pp. 329-352.

(Continued)

*Primary Examiner*—Cuong Q Nguyen
*Assistant Examiner*—Trang Q Tran
(74) *Attorney, Agent, or Firm*—Sughrue Mion, PLLC

(57) ABSTRACT

A pn-heterojunction compound semiconductor light-emitting device includes a crystalline substrate 101, a lower cladding layer 102 formed on a surface of the crystalline substrate and composed of an n-type Group III-V compound semiconductor, a light-emitting layer 103 formed on a surface of the lower cladding layer and composed of an n-type Group III-V compound semiconductor, an upper cladding layer 105 formed on a surface of the light-emitting layer and composed of p-type boron phosphide, an n-type electrode 106 attached to the lower cladding layer and a p-type electrode 107 attached to the upper cladding layer. The lower and upper cladding layers are opposed to each other and sandwich the light-emitting layer to form, in cooperation with the light-emitting layer, a light-emitting portion of a pn-heterojunction structure. The light-emitting device has an intermediate layer 104 composed of an n-type boron-containing Group III-V compound between the light-emitting layer and the upper cladding layer.

12 Claims, 1 Drawing Sheet

FOREIGN PATENT DOCUMENTS

| JP | 6-260682 | 9/1994 |
| JP | 6-268259 | 9/1994 |
| JP | 2003-22971 A | 1/2003 |
| JP | 2003-229601 A | 8/2003 |
| JP | 2003-303779 A | 10/2003 |

OTHER PUBLICATIONS

Iwao Teramoto; "Introduction of Semiconductor Device"; Mar. 30, 1995; pp. 1-3.

T. Udagawa, et al.; "Lattice-Matched Boronphsophide (BP)/Hexagonal GaN Heterostructure for Inhibition of Dislocation Penetration"; Technical Digest; 5th International Conference on Nitride Semiconductors; May 25-30, 2003; Nara, Japan.

Y. Kumasiro, et al.; "Preparation and Electrical Properties of Boron and Boron Phosphide Films Obtained by Gas Source Molecular Beam Deposition"; Journal of Solid State Chemistry; 1997; vol. 133; pp. 269-272.

Y. Saitoh; "Crystal Growth"; Physics Library of Shokabo; Nov. 20, 2002.

\* cited by examiner

COMPOUND SEMICONDUCTOR LIGHT-EMITTING DEVICE HAVING PN-JUNCTION TYPE HETERO STRUCTURE AND FORMING METHOD THEREOF

CROSS REFERENCE TO RELATED APPLICATIONS

This application is an application filed under 35 U.S.C. §111(a) claiming the benefit pursuant to 35 U.S.C. §119(e)(1) of the filing date of Provisional Application Ser. No. 60/518,743 filed Nov. 12, 2003 pursuant to 35 U.S.C. §111(b).

TECHNICAL FIELD

The present invention relates to a compound semiconductor light-emitting device which has a pn-heterojunction structure composed of an n-type Group III-V compound semiconductor layer and a p-type boron phosphide layer, the pn-heterojunction structure providing excellent rectification characteristics, and which exhibits excellent light emission characteristics.

BACKGROUND ART

Conventionally, a Group III nitride semiconductor represented by a compositional formula $Al_xGa_yIn_zN$ ($0 \leq X, Y, Z \leq 1$; $X+Y+Z=1$) has been used in, for example, a Group III nitride semiconductor light-emitting device emitting visible light of short wavelength (see, for example, Book written and edited by Isamu AKASAKI, "Group III-V Compound Semiconductor," published by Baifukan Co., Ltd., Chapter 13, May 20 (1994), first edition). Specifically, the semiconductor is employed to form a p-type cladding layer and an n-type cladding layer in a light-emitting diode (LED) (see the same Book as mentioned above). In a semiconductor light-emitting device, such as an LED and a laser diode (LD), in order to attain high emission efficiency, a light-emitting portion is generally formed of a pn-junction type double hetero (DH) structure (see the same Book as mentioned above). The light-emitting portion of the DH structure refers to a junction structure portion including a light-emitting layer, a p-type cladding layer and an n-type cladding layer, each cladding layer forming a junction with a surface of the light-emitting layer.

In Group III nitride semiconductor light-emitting devices having a pn-junction type DH structure, a light-emitting layer is generally formed of a Group III-V compound semiconductor material, such as gallium indium nitride ($Ga_yIn_zN$ in which $0 \leq Y, Z \leq 1$ and $Y+Z=1$) or gallium nitride phosphide ($GaN_{1-Q}P_Q$ in which $0 \leq Q \leq 1$). Conventionally, a p-type cladding layer for sandwiching the light-emitting layer is generally formed of $Al_xGa_yN$ ($0 \leq X, Y \leq 1$; $X+Y=1$) (see, for example, Japanese Patent No. 2713094). However, in order to obtain a low-resistance p-type Group III nitride semiconductor layer suitable for a barrier layer, doping of the semiconductor layer with a Group II element such as magnesium (Mg) during formation of the layer (a) (see, for example, Japanese Patent No. 2778405) and heat treatment for removing hydrogen atoms from the layer (b) (see, for example, Japanese Patent No. 2540791) must be performed.

Meanwhile, a low-resistance p-type conductive layer is also produced from boron phosphide (BP) to which no impurity is intentionally added; i.e., undoped BP (see, for example, T. Udagawa et al., Technical Digest of 5th. Int. Conf. Nitride Semiconductors, p. 431). Recently, a technique for forming a Group III nitride semiconductor light-emitting device having a pn-junction type DH structure from boron phosphide has been disclosed (see, for example, U.S. Pat. No. 6,069,021).

However, a p-type boron phosphide continuous film cannot be reliably grown on an n-type Group III nitride semiconductor layer. Namely, the formed boron phosphide layer fails to have continuity due to a large number of pits present in the Group III nitride semiconductor layer, thereby disturbing smooth current flow due to its discontinuity and exhibiting high electric resistance. Thus, when such a discontinuous boron phosphide layer is employed as a cladding layer, the fabricated Group III nitride semiconductor light-emitting device has a small light-emitting area attributed to, for example, failing to diffuse device operation current over the layer.

The present invention has been accomplished in order to solve the problems involved in the aforementioned conventional techniques. Thus, an object of the invention is to propose a stacked structure for reliably growing, on an n-type Group III-V compound semiconductor layer, a p-type boron phosphide layer having excellent continuity. Another object of the invention is to provide a compound semiconductor light-emitting device having a pn-junction type heterostructure (hereinafter referred to as "pn-heterojunction compound semiconductor light-emitting device") that contains a p-type boron phosphide layer and which device is formed by use of the stacked structure.

DISCLOSURE OF THE INVENTION

The present invention provides a pn-heterojunction compound semiconductor light-emitting device comprising a crystalline substrate; a lower cladding layer formed on a surface of the crystalline substrate and composed of an n-type Group III-V compound semiconductor; a light-emitting layer formed on a surface of the lower cladding layer and composed of an n-type Group III-V compound semiconductor; an upper cladding layer formed on a surface of the light-emitting layer and composed of p-type boron phosphide; an n-type electrode attached to the lower cladding layer; and a p-type electrode attached to the upper cladding layer, the lower and upper cladding layers being opposed to each other and sandwiching the light-emitting layer, thereby forming, together with the light-emitting layer, a light-emitting portion of a pn-heterojunction structure, wherein the light-emitting device has an intermediate layer composed of an n-type boron-containing Group III-V compound between the light-emitting layer and the upper cladding layer.

In the pn-heterojunction compound semiconductor light-emitting device, the lower cladding layer is composed of $Al_xGa_yIn_zN$ in which $0 \leq X, Y, Z \leq 1$ and $X+Y+Z=1$.

In the first or second mentioned pn-heterojunction compound semiconductor light-emitting device, the light-emitting layer is composed of $Ga_yIn_zN_{1-Q}M_Q$ in which M represents a Group V element other than nitrogen and $0 \leq Q < 1$.

In any one of the first, to third mentioned pn-heterojunction compound semiconductor light-emitting devices, the n-type intermediate layer is composed of boron phosphide.

In any one of the first to fourth mentioned pn-heterojunction compound semiconductor light-emitting devices, the light-emitting layer has an outermost layer composed of an n-type layer of $Ga_xIn_{1-x}N$, in which $0 > X \leq 1$, having a crystal face orientation of (0001) and the n-type intermediate layer is composed of an n-type boron-containing Group III-V compound having a crystal face orientation of (111) and is formed on a surface of the n-type gallium indium nitride layer.

In any one of the first to fifth mentioned pn-heterojunction compound semiconductor light-emitting devices, the n-type intermediate layer is composed of an undoped n-type boron-containing (111)-Group III-V compound whose crystal face orientation of <110> is parallel to an a-axis of an n-type (0001)-Ga$_x$In$_{1-x}$N layer in which 0≦X≦1.

In any one of the first to sixth mentioned pn-heterojunction compound semiconductor light-emitting devices, the n-type intermediate layer has a carrier concentration equal to or lower than that of the p-type boron phosphide layer forming the upper cladding layer provided on the intermediate layer, has a layer thickness of 2 nm to 60 nm and is composed of an undoped n-type boron-containing (111)-Group III-V compound.

The present invention further provides a method for forming a pn-heterojunction compound semiconductor light-emitting device that comprises a crystalline substrate, a lower cladding layer composed of an n-type Group III-V compound semiconductor, a light-emitting layer composed of an n-type Group III-V compound semiconductor, an upper cladding layer composed of p-type boron phosphide, an n-type electrode attached to the lower cladding layer, and a p-type electrode attached to the upper cladding layer, the upper and lower cladding layer sandwiching the light-emitting layer, the method comprising: growing the light-emitting layer; vapor-growing an n-type boron-containing Group III-V compound layer serving as an intermediate layer on the light-emitting layer by use of a source containing a corresponding Group III element and a source containing a corresponding Group V element; and vapor-growing p-type boron phosphide serving as the upper cladding layer on the intermediate layer wherein a ratio of phosphorus source to boron source is controlled to be lower than a ratio of the Group V element source to the Group III element source employed at the growth of the intermediate layer.

In the method for forming a pn-heterojunction compound semiconductor light-emitting device, the boron-containing Group III-V compound is boron phosphide.

In the first or second mentioned method for forming a pn-heterojunction compound semiconductor light-emitting device, the upper cladding layer is vapor-grown from raw material having a ratio of phosphorus source to boron source of 5 to 150.

In any one of the first to third mentioned methods for forming a pn-heterojunction compound semiconductor light-emitting device, the intermediate layer is vapor-grown from raw material having a ratio of Group V element source to Group III element source of 150 to 2,000.

In any one of the first to fourth mentioned methods for forming a pn-heterojunction compound semiconductor light-emitting device, the light-emitting layer composed of an n-type layer of Ga$_x$In$_{1-x}$N, in which 0≦X≦1, having a (0001) face serving as an upper surface is grown, and on the light-emitting layer, the intermediate layer composed of an n-type boron-containing (111)-Group III-V compound is formed at 700° C. to 950° C. and a ratio of Group V element source to Group III element source of 150 to 2,000.

In any one of the first to fifth mentioned methods for forming a pn-heterojunction compound semiconductor light-emitting device, the light-emitting layer composed of an n-type layer of Ga$_x$In$_{1-x}$N, in which 0≦X≦1, having a (0001) face serving as an upper surface is grown, and on the light-emitting layer, the intermediate layer composed of an undoped n-type boron-containing (111)-Group III-V compound whose crystal face orientation of <110> is parallel to an a-axis of the (0001)-Ga$_x$In$_{1-x}$N layer in which 0≦X≦1 is formed at a growth rate of 3 nm/min to 300 nm/min.

In any one of the first to sixth mentioned methods for forming a pn-heterojunction compound semiconductor light-emitting device, the intermediate layer is grown at a growth temperature which is equal to or higher than 700° C. and equal to or lower than a growth temperature for forming the p-type boron phosphide layer that serves as the upper cladding layer, and is formed of an n-type boron-containing (111) Group III-V compound having a carrier concentration equal to or lower than that of the p-type boron phosphide layer.

According to the present invention, a p-type boron phosphide layer is formed by the mediation of an n-type boron-containing Group III-V compound (e.g., boron phosphide). Therefore, the formed p-type boron phosphide layer has continuity and is suitable for forming a low-resistance p-type cladding layer. Thus, device operation current can be caused to diffuse over the light-emitting area, thereby providing a high-light-output pn-heterojunction compound semiconductor LED having a wide light-emitting area.

BEST MODE FOR CARRYING OUT THE INVENTION

Figure 1:
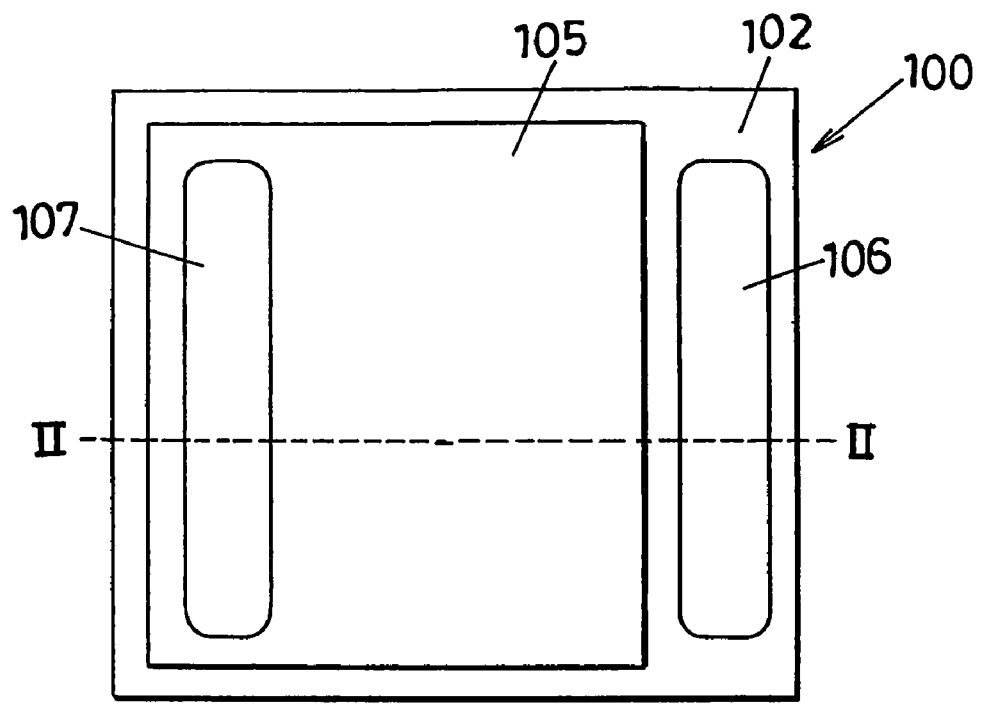
FIG. 1 is a schematic plan view of an LED 100 described in the Example.

The compound semiconductor light-emitting device of the present invention comprises a crystalline substrate, a lower cladding layer composed of an n-type Group III-V compound semiconductor and formed on a surface of the crystalline substrate, a light-emitting layer composed of an n-type Group III-V compound semiconductor and formed on a surface of the lower cladding layer, and an upper cladding layer composed of p-type boron phosphide (BP) and formed on a surface of the light-emitting layer. The light-emitting device further comprises an intermediate layer composed of an n-type boron-containing Group III-V compound (e.g., n-type boron phosphide) and disposed between the light-emitting layer and the upper cladding layer.

Examples of crystalline substrates suitably employed in the present invention include sapphire (α-Al$_2$O$_3$), hexagonal (0001)-silicon carbide and hexagonal (0001)-zinc oxide (ZnO).

The lower cladding layer composed of an n-type Group III-V compound semiconductor is represented by general formula: Al$_x$Ga$_y$In$_z$N (0≦X, Y, Z≦1; X+Y+Z=1), and examples thereof include GaN.

The light-emitting layer composed of an n-type Group III-V compound semiconductor is represented by general formula: Ga$_y$In$_z$N$_{1-Q}$M$_Q$ (M is a Group V element other than nitrogen; 0≦Q<1), and examples thereof include Ga$_y$In$_z$N (0≦Y, Z≦1; Y+Z=1) and GaN$_{1-Q}$P$_Q$ (0≦Q<1).

The p-type boron phosphide (BP) forming the upper cladding layer can be obtained through the method described in the Technical Digest referred to above; i.e., metal-organic chemical vapor deposition (MOCVD) employing an organic boron compound as a boron source and a hydride as a phosphorus source.

The intermediate layer of the present invention is provided between the n-type Group III-V compound semiconductor layer and the p-type boron phosphide layer particularly in such a manner that the intermediate layer is in contact with the upper surface of the n-type Group III-V compound semiconductor layer and with the lower surface of the p-type boron phosphide layer. The intermediate layer is provided in order to form a smooth, continuous p-type boron phosphide layer on the n-type Group III-V compound semiconductor layer. In order to grow a continuous p-type boron phosphide layer, the intermediate layer must be formed from a material which can sufficiently cover the upper surface of the n-type Group III-V compound semiconductor layer and which attains intimate adhesion to the p-type boron phosphide layer. From this viewpoint, a boron-containing Group III-V compound semiconductor material having excellent wettability (Yukio SAITO, "Crystal Growth," Shokabo Co., Ltd., Nov. 20, 2002, 1st edition, pp. 31-34) with respect to a boron-containing n-type Group III-V compound semiconductor material is suitable for forming the intermediate layer. The boron-containing Group III-V compound semiconductor is also advantageous in that the semiconductor accelerates growth of a p-type boron phosphide layer containing boron as an essential element and can serve as a base layer for providing a continuous film.

Examples of the boron-containing Group III-V compound semiconductor include boron aluminum phosphide ($B_\alpha Al_{1-\alpha}P$ in which $0<\alpha \leq 1$), boron gallium phosphide ($B_\alpha Ga_{1-\alpha}P$ in which $0<\alpha \leq 1$) and boron indium phosphide ($B_\alpha In_{1-\alpha}P$ in which $0<\alpha \leq 1$), and compound semiconductors containing arsenic (As) as an essential element, such as boron aluminum arsenide ($B_\alpha Al_{1-\alpha}As$ in which $0<\alpha \leq 1$), boron gallium arsenide ($B_\alpha Ga_{1-\alpha}As$ in which $0<\alpha \leq 1$) and boron indium arsenide ($B_\alpha In_{1-\alpha}As$ in which $0<\alpha \leq 1$). Among the boron-containing Group III-V compound semiconductors, boron phosphide (BP) is particularly preferred as a material for forming the intermediate layer, since BP lattice-matches with the p-type boron phosphide layer.

Taking boron phosphide as an example of the boron-containing Group III-V compound, the present invention will next be further described.

The boron phosphide layer for forming the intermediate layer may be formed through the halogen method, the hydride method, the MOCVD (metal-organic chemical vapor deposition) method, or the molecular-beam epitaxy method (see J. Solid State Chem., 133(1997), pp. 269-272). The intermediate layer is preferably grown at a relatively low temperature in order to prevent thermal deterioration of the material forming the light-emitting layer (e.g., n-type Group III nitride semiconductor layer). Particularly when setting the growth temperature to be equal to or lower than the temperature at which a p-type boron phosphide layer is formed on the intermediate layer, thermal deterioration of the light-emitting layer is effectively prevented. In order to reliably form the intermediate layer not in the form of island-like pattern but in the form of continuous layer, the intermediate layer is preferably grown at 700° C. or higher. In one embodiment, gallium indium nitride ($Ga_x In_{1-x}N$ in which $0 \leq X \leq 1$) is grown through MOCVD at 800° C., followed by forming an intermediate layer composed of boron phosphide at 800° C. When the same vapor growth apparatus as employed in the growth of the n-type Group III nitride semiconductor layer serving as the light-emitting layer is utilized, the intermediate layer can be formed in a simple manner.

When the ratio of Group V material to Group III material (hereinafter referred to as V/III ratio) is elevated during the growth of a Group III-V compound semiconductor layer (particularly a boron phosphide layer), the grown film has excellent continuity. Thus, the film is suitably used for forming the intermediate layer. In the vapor growth of a born phosphide layer, the terms "Group III source" and "Group V source" refers, respectively, to a boron (B) source and a phosphorus (P) source employed in the growth. The V/III ratio refers to a ratio of phosphorus element contained in a phosphorus source to boron element contained in a boron source, the two sources being fed to a vapor-growth reaction system. When the V/III ratio is controlled to 150 to 2,000, a boron phosphide layer having remarkably excellent continuity can be formed on an n-type layer of (0001)-indium gallium nitride ($Ga_x In_{1-x}N$ in which $0 \leq X \leq 1$). When the V/III ratio is less than 150, the feed amount of phosphorus is insufficient with respect to that of boron, thereby failing to reliably form a continuous boron phosphide film, whereas when the V/III ratio is in excess of 2,000, phosphorus-containing matter deposits, thereby failing to reliably form a flat boron phosphide layer suitable for serving as the intermediate layer.

The boron phosphide layer which has been grown at a V/III ratio falling within the aforementioned preferred range (called first V/III ratio) assumes a continuous layer and an n-type conducting layer, which is provided by virtue of an appropriate feed ratio of the amount of phosphorus source to the amount of boron source. The n-type boron phosphide layer suitable for the intermediate layer has a carrier concentration equal to, or lower than, that of the p-type boron phosphide layer provided thereon. Preferably, the n-type boron phosphide layer is not a high-resistance layer but a conductive layer having a carrier concentration of at least $1 \times 10^{17}$ cm$^{-3}$ so as not to disturb current flow from the p-type boron phosphide layer to the light-emitting layer. The n-type boron phosphide layer may be formed in an undoped state (i.e., no impurity intentionally added), and the carrier concentration of the layer may be adjusted by modifying the V/III ratio or the growth temperature during vapor growth. So long as the temperature and V/III ratio during the vapor growth of the aforementioned boron phosphide layer fall within suitable ranges, the carrier concentration of the boron phosphide layer can be elevated as elevating the growth temperature or the V/III ratio.

By controlling the rate of growing the boron phosphide layer within a preferred range of 3 nm/min to 300 nm/min, there can be formed n-type (111)-boron phosphide of a cubic zincblende crystal form whose crystal face orientation of <110> is parallel to the a-axis of the n-type layer of (0001)-gallium indium nitride ($Ga_x In_{1-x}N$ in which $0 \leq X \leq 1$). The lattice constant of the a-axis of wurtzite crystal form $Ga_x In_{1-x}N$ ($0 \leq X \leq 1$) falls within a range of 0.319 nm to 0.353 nm (see, Iwao Teramoto, "Introduction of Semiconductor Device," Mar. 30, 1995, published by Baifukan, 1st edition, p. 28), and the lattice plane spacing of the {110}—plane of boron phosphide (BP) is 0.320 nm. By virtue of close matching between the lattice constant of the a-axis and the lattice plane spacing of the {110}-plane, the (111)-boron phosphide layer whose <110> orientation is parallel to the a-axis of (0001)-$Ga_x In_{1-x}N$ ($0 \leq X \leq 1$) attains remarkably intimate adhesion particularly to the (0001)-$Ga_x In_{1-x}N$ ($0 \leq X \leq 1$) layer. Thus, the intermediate layer can be suitably formed from such a boron phosphide layer attaining intimate adhesion. Meanwhile, a $Ga_x In_{1-x}N$ ($0 \leq X \leq 1$) layer having a crystal face orientation of (0001) can be grown on a hexagonal (0001) crystalline substrate, such as (0001)-sapphire ($\alpha$-$Al_2O_3$), hexagonal (0001)-silicon carbide (SiC) and (0001)-zinc oxide (ZnO).

The intermediate layer of the present invention is preferably composed of boron phosphide. However, the aforementioned similar compounds in which boron atoms are partially substituted by aluminum atoms or indium atoms, and those in which phosphorus atoms are substituted by arsenic atoms may also be employed.

On the n-type intermediate layer, a p-type boron phosphide layer is provided. Since the p-type boron phosphide layer is grown on, as a base layer, the intermediate layer composed of an n-type boron phosphide layer which lattice-matches the p-type boron phosphide layer, a continuous boron phosphide layer can be formed by controlling the V/III ratio to 5 or more. From another point of view, the V/III ratio at which a p-type conducting layer is grown (called second V/III ratio) is controlled to be equal to or lower than the first V/III ratio at which the n-type boron phosphide layer is vapor-grown. The second V/III ratio is preferably 5 to 150. The p-type boron phosphide layer is a function layer provided for injecting holes to the light-emitting layer. In a stacked structure in which a p-type boron phosphide layer is formed by the mediation of an n-type intermediate layer, when the n-type intermediate layer is excessively thick, holes are combined with electrons present in the n-type intermediate layer, which is disadvantageous for effective injection of holes to the light-emitting layer. Therefore, the n-type intermediate layer suitably has a thickness of 60 nm or less. In contrast, an extremely thin intermediate layer is insufficient to cover the upper surface of the n-type Group III nitride semiconductor layer. In this case, a continuous boron phosphide layer cannot reliably be formed on the n-type Group III nitride semiconductor layer at a low V/III ratio. Therefore, the n-type intermediate layer suitably has a thickness of 2 nm or more.

The intermediate layer composed of an n-type boron phosphide layer or a similar layer satisfactorily covers the upper surface of the n-type Group III nitride semiconductor layer during provision of a p-type boron phosphide layer on the n-type Group III nitride semiconductor layer. Thus, the intermediate layer can reliably provide a p-type boron phosphide layer having excellent continuity.

EXAMPLE

Figure 2:
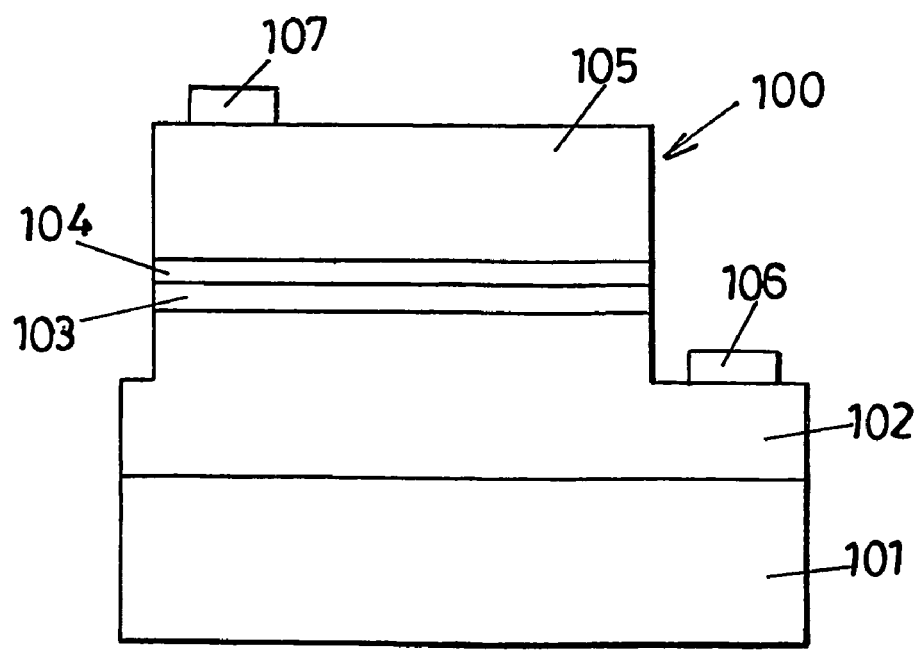
FIG. 2 is a schematic cross-sectional view of the LED 100 shown in FIG. 1, taken along broken line II-II shown in FIG. 1.

The present invention will next be described in detail with reference to the case in which a Group III nitride semiconductor LED is fabricated by use of a p-type boron phosphide layer provided by the mediation of an n-type boron phosphide layer. FIG. 1 is a schematic plan view of an LED 100 described in the Example. FIG. 2 is a schematic cross-sectional view of the LED 100, taken along broken line II-II shown in FIG. 1.

On a (0001)-sapphire ($Al_2O_3$ single crystal) substrate 101, a lower cladding layer 102 composed of an Si-doped n-type GaN layer (carrier concentration=$7 \times 10^{18}$ cm$^{-3}$, thickness=3.1 μm) and a light-emitting layer 103 composed of an n-type gallium indium nitride ($Ga_{0.92}In_{0.08}N$) layer (carrier concentration=$8 \times 10^{17}$ cm$^{-3}$, thickness=0.08 μm) were sequentially stacked. The upper surface of the $Ga_{0.92}In_{0.08}N$ layer was confirmed to assume a crystal face orientation of (0001) through a conventional X-ray diffraction method. The above GaN layer and $Ga_{0.92}In_{0.08}N$ layer were grown through a normal pressure (near atmospheric pressure) MOCVD method by use of trimethyl gallium (($CH_3$)$_3$Ga)/ammonia ($NH_3$)/hydrogen ($H_2$) reaction system. The GaN layer serving as the lower cladding layer was grown at 1,100° C., and the $Ga_{0.92}In_{0.08}N$ layer serving as the light-emitting layer 103 was grown at 850° C.

After completion of vapor growth of the light-emitting layer 103 composed of (0001)-$Ga_{0.92}In_{00.8}N$, an n-type boron phosphide (BP) layer serving as an intermediate layer 104 was formed at 850° C. on the (0001) face of the light-emitting layer 103. The BP layer serving as the intermediate layer 104 was grown from triethylborane (($C_2H_5$)$_3$B) as a boron source and phosphine ($PH_3$) as a phosphorus source through a normal pressure (near atmospheric pressure) MOCVD method by use of a ($C_2H_5$)$_3$B/$PH_3$/hydrogen ($H_2$) reaction system. The boron phosphide layer serving as the intermediate layer 104 was grown at a supply ratio of phosphorus source to boron source (V/III ratio =$PH_3$/($C_2H_5$)$_3$B supply ratio by concentration) of 430. Thus, the formed undoped boron phosphide layer was found to be an n-type conducting layer having a carrier concentration of $6 \times 10^{18}$ cm$^{-3}$. The thickness of the n-type boron phosphide layer serving as the intermediate layer 104 was controlled to 0.02 μm.

Subsequently, through employment of the aforementioned atmospheric pressure MOCVD method by use of a ($C_2H_5$)$_3$B/$PH_3$/$H_2$ reaction system, an undoped boron phosphide layer serving as an upper cladding layer 105 was deposited on the intermediate layer 104. This p-type boron phosphide layer was grown at 1,025° C. The V/III ratio during the vapor growth was adjusted to 20. Since the boron phosphide layer was grown at a higher temperature and a lower V/III ratio as compared with the boron phosphide layer serving as the intermediate layer 104, the formed p-type boron phosphide layer was a low-resistance conducting layer having a carrier concentration of $1 \times 10^{19}$ cm$^{-3}$. The thickness of the upper cladding layer 105 was controlled to 1.1 μm.

The p-type boron phosphide layer serving as the upper cladding layer 105 was patterned through a conventional photolithography technique. Subsequently, as shown in FIGS. 1 and 2, a portion of the p-type BP upper cladding layer 105, a portion of the n-type BP intermediate layer 104 and a portion of the n-type $Ga_{0.92}In_{0.08}N$ light-emitting layer 103 were removed through a conventional plasma etching means by use of chlorine ($Cl_2$) gas. On the surface of the n-type GaN lower cladding layer 102 exposed through plasma etching, a lanthanum-aluminum alloy layer 106a and an aluminum layer 106b were sequentially deposited through a conventional vacuum deposition means to thereby form an n-type ohmic electrode 106. On an edge of the surface of the upper cladding layer 105 composed of a p-type BP layer, nickel (Ni) and gold (Au) were sequentially deposited through the electron-beam deposition method to thereby form a p-type ohmic electrode 107. Both ohmic electrodes 106 and 107 were not subjected to alloying.

Upon passage of forward current of 20 mA between the n-type ohmic electrode 106 and the p-type ohmic electrode 107, the LED 100 emitted blue light having an emission center wavelength of about 430 nm. The forward voltage was found to be 3.4 V, and the reverse voltage was found to be 8.3 V at a reverse current of 10 μA. According to the configuration of the LED 100 of the Example, the upper cladding layer 105 composed of a p-type boron phosphide layer was provided on the intermediate layer 104 composed of n-type boron phosphide. Therefore, the formed p-type layer had excellent continuity and low electrical resistance. By virtue of the p-type layer, forward current was able to be diffused virtually over the light-emitting area, and in the form of a chip a blue-light LED emitting blue light of emission output as high as 8 mW was provided.

INDUSTRIAL APPLICABILITY

The present invention can be used as a compound semiconductor LED having wide light-emitting area and high light emission output.

The invention claimed is:

1. A pn-heterojunction compound semiconductor light-emitting device comprising a crystalline substrate; a lower cladding layer formed on a surface of the crystalline substrate and composed of an n-type Group III-V compound semiconductor; a light-emitting layer formed on a surface of the lower cladding layer and composed of an n-type Group III-V compound semiconductor; an upper cladding layer formed on a surface of the light-emitting layer and composed of p-type boron phosphide; an n-type electrode attached to the lower cladding layer; and a p-type electrode attached to the upper cladding layer, the lower and upper cladding layers being opposed to each other and sandwiching the light-emitting layer, thereby forming, together with the light-emitting layer, a light-emitting portion of a pn-heterojunction structure, wherein the light-emitting device has an intermediate layer composed of an n-type boron-containing Group III-V compound between the light-emitting layer and the upper cladding layer; and wherein the light-emitting layer has an outermost layer composed of an n-type layer of $Ga_xIn_{1-x}N$, in which $0 \leq X \leq 1$, having a crystal face orientation of (0001) and the n-type intermediate layer is composed of an undoped n-type boron-containing (111)-Group III-V compound having a crystal face orientation of (111) and a direction of <110> parallel to an a-axis of an n-type (0001)-$Ga_xIn_{1-x}N$, in which $0 \leq X \geq 1$, and is formed on the outermost layer of the light-emitting layer.

2. The pn-heterojunction compound semiconductor light-emitting device according to claim 1, wherein the lower cladding layer is composed of $Al_xGa_yIn_xN$ in which $0 \leq X, Y, Z \leq 1$ and $X+Y+Z=1$.

3. The pn-heterojunction compound semiconductor light-emitting device according to claim 1, wherein the light-emitting layer is composed of $Ga_yIn_zN_{1-Q}M_Q$, in which M represents a Group V element other than nitrogen and $0 \leq Q < 1$.

4. The pn-heterojunction compound semiconductor light-emitting device according to claim 1, wherein the n-type intermediate layer is composed of boron phosphide.

5. The pn-heterojunction compound semiconductor light-emitting device according to claim 1, wherein the n-type intermediate layer has a carrier concentration equal to or lower than that of the p-type boron phosphide layer forming the upper cladding layer provided on the intermediate layer, has a layer thickness of 2 nm to 60 nm and is composed of an undoped n-type boron-containing (111)-Group III-V compound.

6. A method for forming a pn-heterojunction compound semiconductor light-emitting device comprising a crystalline substrate; a lower cladding layer formed on a surface of the crystalline substrate and composed of an n-type Group III-V compound semiconductor; a light-emitting layer formed on a surface of the lower cladding layer and composed of an n-type Group III-V compound semiconductor; an upper cladding layer formed on a surface of the light-emitting layer and composed of p-type boron phosphide; an n-type electrode attached to the lower cladding layer; and a p-type electrode attached to the upper cladding layer, the lower and upper cladding layers being opposed to each other and sandwiching the light-emitting layer, thereby forming, together with the light-emitting layer, a light-emitting portion of a pn-heterojunction structure, wherein the light-emitting device has an intermediate layer composed of an n-type boron-containing Group III-V compound between the light-emitting layer and the upper cladding layer; and wherein the light-emitting layer has an outermost layer composed of an n-type layer of $Ga_xIn_{1-x}N$, in which $0 \leq X \leq 1$, having a crystal face orientation of (0001) and the n-type intermediate layer is composed of an undoped n-type boron-containing (111)-Group III-V compound having a crystal face orientation of (111) and a direction of <110> parallel to an a -axis of an n-type (0001)-$Ga_xIn_{1-x}N$, in which $0 \leq X \leq 1$ and is formed on the outermost layer of the light-emitting layer, said method comprising:

growing the light-emitting layer;

vapor-growing an n-type boron-containing Group III-V compound layer serving as an intermediate layer on the light-emitting layer by use of a source containing a corresponding Group III element and a source containing a corresponding Group V element; and vapor-growing p-type boron phosphide serving as the upper cladding layer on the intermediate layer wherein a ratio of phosphorus source to boron source is controlled to be lower than a ratio of the Group V element source to the Group III element source employed at the growth of the intermediate layer.

7. The method for forming a pn-heterojunction compound semiconductor light-emitting device according to claim 6, wherein the boron-containing Group III-V compound is boron phosphide.

8. The method for forming a pn-heterojunction compound semiconductor light-emitting device according to claim 6, wherein the upper cladding layer is vapor-grown from raw material having a ratio of phosphorus source to boron source of 5 to 150.

9. The method for forming a pn-heterojunction compound semiconductor light-emitting device according to claim 6, wherein the intermediate layer is vapor-grown from raw material having a ratio of Group V element source to Group III element source of 150 to 2,000.

10. The method for forming a pn-heterojunction compound semiconductor light-emitting device according to claim 6, wherein the light-emitting layer composed of an n-type layer of $Ga_xIn_{1-x}N$, in which $0 \leq X \leq 1$ having a (0001) face serving as an upper surface is grown, and on the light-emitting layer, the intermediate layer composed of an n-type boron-containing (111)-Group III-V compound is formed at 700° C. to 950° C. and a ratio of Group V element source to Group III element source of 150 to 2,000.

11. The methods for forming a pn-heterojunction compound semiconductor light-emitting device according to claim 6, wherein the light-emitting layer composed of an n-type layer of $Ga_xIn_{1-x}N$, in which $0 \leq X \leq 1$ having a (0001) face serving as an upper surface is grown, and on the light-emitting layer, the intermediate layer composed of an undoped n-type boron-containing (111)-Group III-V compound whose crystal face orientation of <110> is parallel to an a-axis of the (0001)-$Ga_xIn_{1-x}N$ layer in which $0 \leq X \leq 1$ is formed at a growth rate of 3 nm/min to 300 nm/min.

12. The method for forming a pn-heterojunction compound semiconductor light-emitting device according to claim 6, wherein the intermediate layer is grown at a growth temperature which is equal to or higher than 700° C. and equal to or lower than a growth temperature for forming the p-type boron phosphide layer that serves as the upper cladding layer, and is formed of an n-type boron-containing (111) Group III-V compound having a carrier concentration equal to or lower than that of the p-type boron phosphide layer.

* * * * *